United States Patent [19]

Kawabata et al.

[11] Patent Number: 4,952,295

[45] Date of Patent: Aug. 28, 1990

[54] METHOD OF PRODUCING A DEPOSITION FILM OF COMPOSITE MATERIAL

[75] Inventors: Hidetsugu Kawabata, Hirakata; Yoshihiko Kudoh, Yawata; Motoyoshi Murakami, Hirakata; Norio Miyatake, Kobe; Masakazu Yamamoto, Kawanishi, all of Japan

[73] Assignee: Matsushita Electric Industrial Co., Ltd., Osaka, Japan

[21] Appl. No.: 337,888

[22] Filed: Apr. 14, 1989

[30] Foreign Application Priority Data

Apr. 15, 1988 [JP] Japan .................................. 63-93758
Sep. 1, 1988 [JP] Japan ................................. 63-219027

[51] Int. Cl.$^5$ ............................................. C23C 14/34
[52] U.S. Cl. ............................. 204/192.15; 204/192.16; 204/192.23
[58] Field of Search ....................... 204/192.11, 192.15, 204/192.2, 192.26, 192.27, 298 SC, 298 MB, 298 MR, 192.14, 192.16, 192.23

[56] References Cited

U.S. PATENT DOCUMENTS

| | | | |
|---|---|---|---|
| 3,933,644 | 1/1976 | Skinner et al. | 204/298 MD |
| 4,260,466 | 4/1981 | Shirahata et al. | 204/192.11 X |
| 4,279,726 | 7/1981 | Baird et al. | 204/192.26 |
| 4,430,183 | 2/1984 | Schuller et al. | 204/192.11 |
| 4,576,699 | 3/1986 | Sato et al. | 204/192.26 |
| 4,793,908 | 12/1988 | Scott et al. | 204/192.26 |

OTHER PUBLICATIONS

Weissmantel et al., "New Developments . . . Techniques", Pro. 6th Internl. Vacuum Congr., 1974, Japan, J. Appl. Physics Suppl. 2, Pt. 1, 1974, pp. 509–512.

"New Protective Layer for an Optical Disk", reported by Krumizawa et al.

Primary Examiner—Nam X. Nguyen
Attorney, Agent, or Firm—Wenderoth, Lind & Ponack

[57] ABSTRACT

In a method of producing a deposition film of a composite material, a plurality of sputtering targets each containing one of a plurality of different components are disposed separately in a vacuum chamber. A substrate is subjected to sputtering from the sputtering targets while being moved at an adequately high speed relative to a deposition rate from each sputtering target so that extremely thin layers of the respective components are sequentially stacked repeatedly a plurality of times to thereby form a deposition film of a composite material in which the plurality of different components are mixed uniformly.

1 Claim, 1 Drawing Sheet

METHOD OF PRODUCING A DEPOSITION FILM OF COMPOSITE MATERIAL

BACKGROUND OF THE INVENTION

1. Field of the Invention

The present invention relates to a deposition method for producing a thin film of composite material, such as a protective film for a magneto-optical recording medium.

2. Description of the Prior Art

Conventionally, composite material films are produced by sputtering using a single target containing essential components of the film to be formed or by cosputtering using a plurality of targets of respective components of the film to be formed. In the former method, it is necessary to previously prepare a sputtering target of the composite material in a vacuum at a high temperature, and in addition the sputtering target should be produced while considering the inevitably-occurring difference in composition between the deposited film and the sputtering target, the difference varying according to the conditions of sputtering. The cosputtering method is disadvantageous in that the substrate must be located within a relatively narrow and restricted area where necessary sputtering conditions from all of the targets are satisfied, and in that deposition efficiency and filming rate are reduced because of sputtering out of the substrate.

There have been proposed three types of magneto-optical recording materials: (1) rare earth-transition metal amorphous thin films, (2) Heusler alloy film, and (3) oxide magnetic films composed of materials such as garnet and ferrite. They are formed by LPE, CVD or sputtering methods. However, the type (1) material is too readily oxidized and does not have the necessarily adequate magneto-optical effect. Types (2) and (3) materials include those which are hardly oxidized and have large magneto-optical effect, but they are crystalline materials, which are low in film-forming rate, require high heat-treatment temperature, and require an expensive mono-crystal substrate.

When a recording film formed on a plastic substrate such as polycarbonate is made of such a material such as a rare earth-transition metal alloy or a chalcogenide alloy, which is relatively easily oxidized or eroded, it is necessary to cover both surfaces of the recording film with protective films. In other words, recording disks are of a sandwich structure in which the recording medium layer is placed between the protective films. Further, to increase the light absorption efficiency and recording sensitivity of the recording material or to increase the Kerr rotation angle, the protective film on the side exposed to the light beam is made of a material having a high refraction index, and its thickness d is set to satisfy $d = \lambda/4n$ (where $\lambda$: wavelength of the light beam, n: refractive index of the protective film material).

These protective films are conventionally made by vacuum-evaporation of ZnS having a refractive index of about 2.3, sputtering of ZnS or an oxide such as $SiO_2$ in Ar gas atmosphere, sputtering from SiN target in Ar gas atmosphere, or reactive sputtering from Si target or SiN target in $N_2$ or Ar gas atmosphere. By sputtering of silicon nitride or silicon nitride oxide to a plastic substrate, a dense film is formed which has a small permeability to gas providing a good protective effect, a low oxygen content, and a refractive index of 1.95, but on the other hand which is inferior in cracking-proofness. Hence optical disks provided with such a film are easily damaged by repeated cycles of recording and erasure or by a sudden change in ambient temperature. In other words, they cannot satisfy the required protective effect, recording sensitivity and mechanical strength at the same time.

The method by electron beam vacuum deposition or sputtering of $SiO_2$ (n=1.5) is disadvantageous in low recording sensitivity and in promoted oxidation of the recording film due to containing of free oxygen at the boundary between the recording film and the protective film during deposition. In particular, the magneto-optical film may undergo changes in composition due to selective oxidation of rare earth element components, accompanied by changes in coercive force as time passes, which causes changes in the shape of recorded bits and/or increases in modulation noise.

The method by sputtering or vacuum deposition of ZnS (n=2.3) is involved in relatively rapid erosion of recording medium due to the permeability of the plastic substrate to water and oxygen. For instance, a TbFeCo film formed between films of ZnS of 90 nm in thickness on a polycarbonate substrate demonstrated that small spots were caused in it at 80° C. and relative humidity of 80% already after 700 hours passed.

As described above, none of the conventional methods of forming protective films satisfies simultaneously all of the following requirements:

(1) To form films which is chemically stable and which have such a low permeability to water and oxygen that sufficient protective effect is provided;

(2) To form films having sufficient mechanical strength against repeated recording and erasure and changes in use conditions;

(3) To form films having higher refractive indexes than 2; and (4) To be of high deposition rate, good reproducibility of the film properties, and high productivity.

SUMMARY OF THE INVENTION

An object of the present invention is to provide a readily-controllable and mass-productive method of producing a deposition film of a composite material which is uniform in film thickness and in composition by use of a plurality single-component targets instead of a composite target.

Another object of the present invention is to provide a method of producing a protective film for an optical recording medium, satisfying all of the following requirements:

(1) To protect a recording medium from erosion;

(2) To have sufficient mechanical strength against cracking, and the like;

(3) To have a refractive index high enough to improve recording sensitivity and signal-to-noise ratio (S/N); and (4) To be formed at a high deposition rate with good reproducibility of the film properties.

Still another object of the present invention is to provide a method of producing, on a cheap substrate such as plastic, a magneto-optical recording medium which is chemically stable and which has an excellent magneto-optical effect.

According to the present invention, a plurality of sputtering targets each of a single component different from that of another are disposed separately from one another in a single vacuum chamber, and a substrate is moved at an adequately high speed relative to a deposition rate from each sputtering target so that thin layers of respective components each having a thickness in the order of an inter-atom distance (at most 5 nm) are sequentially stacked repeatedly a plurality of times thereby to obtain a film of a composite material which is a mixture or solid solution of components of the plurality of sputtering targets. In a preferred arrangement, the plurality of sputtering targets are disposed circularly on a same plane, and the substrate is rotated on a plane parallel to the target disposed plane. An ion beam may be applied to the substrate to form a crystalline film.

According to the method of the present invention, a large number of extremely thin layers of respective components each having a uniform thickness are uniformly stacked to form a film of a composite material, so that the distribution of components in the film is uniform. In other words, a deposition film of a composite material in which a plurality of components are uniformly distributed can be produced easily and rapidly. The produced film shows advantageous properties possesed by the individual components contained therein.

DESCRIPTION OF THE PREFERRED EMBODIMENTS

Figure 1:
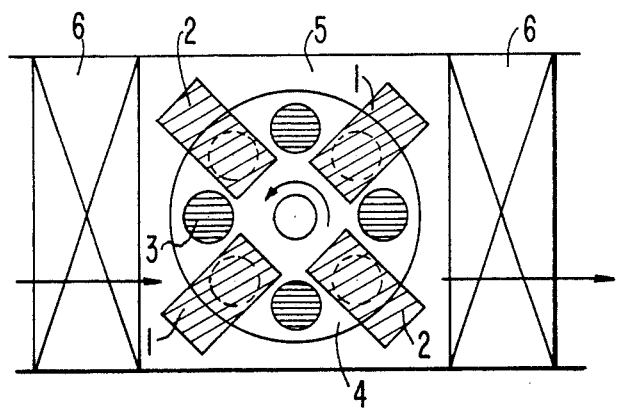
FIG. 1 is a schematic diagram illustrating a system for practicing a film-forming process embodying the invention.

Embodiments of the invention will be described in detail with reference to the accompanying drawings hereinafter, in which reference numerals designate as follows: 1 first-component target, 2 second-component target, 3 substrate, 4 pallet carrying substrates, 5 film-forming chamber, 6 gate valve, 7 Sb target, 8 Mn target, 9 Pt target, 10 ion beam source.

Embodiment 1

Referring to FIG. 1, in a vacuum chamber 5 four sputtering targets 1, 2 (each 5 inch × 8 inch in size), two of which (1) being of ZnSe (refractive index = 2.6 to 2.7), the main component of a protective film, especially for magneto-optical recording medium, to be deposited and the others (2) being of $SiO_2$, the secondary glassy material component, are alternatively arranged so that each target of one type is positioned between targets of the other type. There are provided a circular pallet 4 (as of 1m in outer diameter) carrying 10 to 100 disk-shaped substrates 3 (as of plastic) arranged circularly in one or two rows inwardly along the circumference (the number of them is altered in accordance with the outer diameter of each substrate). While sputtering from each target, the pallet is rotated at a sufficiently high speed (20 to 100 rpm) compared with the film-component deposition rate (10 to 40 nm/min) from each target. Thus each substrate is revolving at a high speed to repeatedly pass positions opposing the targets one after another. Thus, each substrate is subjected to alternating sputtering of ZnSe and $SiO_2$, resulting in the of formation a plurality of extremely thin layers of individual components each having a thickness of an inter-atom distance order as small as up to 1–5 nm. In virtue of such a very thin thickness of each film layer deposited every pass-by and alternate stacking of the film layers of both components by turns, a protective composite material $(ZnSe + SiO_2)$ film of solid solution in which both components were uniformly-distributed in very small size of an order of magnitude of atoms can be formed. Compared with a single component (ZnSe) film, the composite material $(ZnSe + SiO_2)$ film has a much greater protective effect against erosion of the recording medium (film) caused by oxygen and water, and its refractive index can be increased to 2.3 or more by changing the content of the secondary component. When equal power was supplied to each of the sputtering targets arranged as described above and having an identical area, the molar ratio of ZnSe to $SiO_2$ in the formed film was 4:1. In this case, the refractive index of the composite material film became 2.35, which is more than that of ZnS. The main component may be any other material having a refractive index of at least 2.

Films of a thickness of 80 nm formed as described above gave ±4% or less in film thickness distribution in both cases of outer diameters 5.25" and 3.5". The formation of these protective films on both sides of a magneto-optical medium of DyFeCo or TbFeCo into an optical disk resulted in about a 10% improvement compared with the protective SiN film, and thus at a medium movement velocity of 15 m/sec, recording by 8 mw power laser became possible. Additionally, an improvement in C/N of 1 dB or more was obtained as compared with an optical disk which is the same as the above-mentioned except for having protective films of SiN. The protective films on a polycarbonate substrate had sufficiently great cracking-proofness to remain unaffected by abrupt temperature change between −20° to +60° C. Protective SiN films having a refractive index of 1.95 could not prevent the occurrence of cracks in part of them after 100 times-repeated temperature change cycles between −20° and +60° C.

The process according to the invention enables reduction of deposition time compared with the conventional sputtering technique with oxide or nitride.

Hitherto metallic films have been deposited as recording media of the optical disk, and formation of them could be accomplished by DC sputtering. On the other hand, due to the use of one selected from the group consisting of insulators or some semiconductors for forming protective films, RF sputtering only could be applied, and this is involved in taking a long time for film deposition compared with that of magnetic films, and the reduction of protective film-formation times has presented the greatest problem with improvement in mass-productivity of optical disk. The problem has been solved by the present invention, particularly with the protective $(ZnSe + SiO_2)$ film which can be formed in the process of the present invention.

Table 1 shows deposition rates with various materials as sputtering target or target at sputtering power thermally allowed for the polycarbonate substrate by the use of the system having the structure as shown in FIG. 1.

TABLE 1

| | Deposition rate with various targets | |
|---|---|---|
| Target | Number (Arrangement) | Deposition rate (Relative value) |
| ZnSe | 2 | |
| $SiO_2$ | 2 | 12 |

TABLE 1-continued

| Target | Deposition rate with various targets | |
|---|---|---|
| | Number (Arrangement) | Deposition rate (Relative value) |
| | (Alternate) | |
| ZnSe | 4 | 20 |
| ZnS | 4 | 10 |
| SiO$_2$ | 4 | 4 |
| SiN | 4 | 1–3 |

The alternate arrangement of the ZnSe target and SiO$_2$ target proved to have the effect of giving at least an equal rate of forming the composite material (ZnSe+SiO$_2$) film compared with that of ZnS, and enabled a much higher sputtering rate compared with the SiN or SiO$_2$ sputtering.

Further, with the TbCoFe medium placed between the (ZnSe+SiO$_2$) films of 80 nm thick, neither coercive force reduction nor erosions were observed after 1000 hours standing of it under conditions of 80° C. and relative humidity of 80%. On the other hand, with a disk consisting of the same medium and protective ZnS films of 80 nm in thickness sandwiching it therebetween there were found minute spots of erosion after 700 hours' standing under the same conditions.

As described above, advantages of the present invention reside in the process for forming protective films for optical recording media, which meet the combined requirements of protective effect on erosion, good mechanical strength, for example, against cracking, high refractive index associated with high recording sensitivity, high deposition rate, easy preparation of sputtering targets, etc., which were incompatible requirements in the prior art.

Embodiment 2

The process of forming a recording medium according to this embodiment repeats a plurality of times a cycle of deposing each of a plurality of components on the moving substrates from different sources, and irradiating an inert gas ion beam or oxygen ion beam onto the substrates.

The extremely thin (thickness 1–5 nm or less) layers of individual components of the optical recording medium are being deposited while being irradiated with a high energy beam of inert gas ions (oxygen ions for optical recording medium of oxide so as to prevent the shortage of oxygen in the medium which otherwise may occur) to fuse together and crystallize the layers without causing the separation of them. This cycle is repeated to easily make a homogeneous crystalline optical recording medium of 20 to 100 nm in final thickness on an inexpensive substrate.

Figure 2:
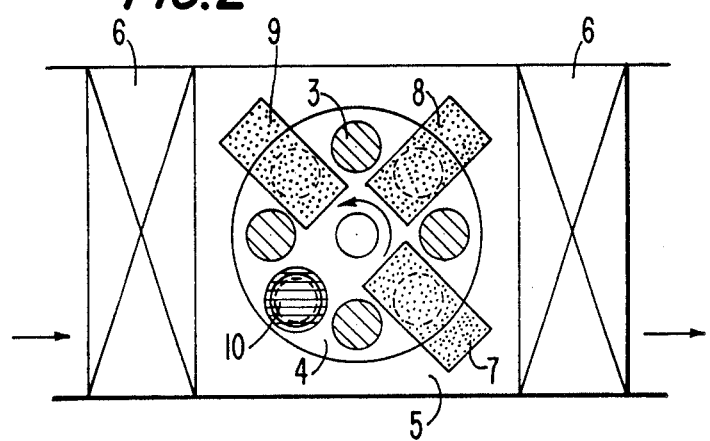
FIG. 2 is a schematic diagram illustrating a system for practicing a process for making magneto-optical media embodying the invention.

A schematic diagram for illustrating a system for practicing this process for making an optical recording medium is shown in FIG. 2 where reference numerals designate as follows: 7 a sputtering target of Sb which is a first component of the optical recording medium according to the present invention, 8 another sputtering target of Mn which is a second component, 9 a further sputtering target of Pt, a third component, and 10 an ion beam target for irradiating an Ar ion beam directed to the moving substrates.

While rotating the pallet, and every time each substrate passes by each target, very thin layers of Sb, Mn and Pt, respectively, are formed in turn to stack over one another, and then these layers are exposed to the Ar ion beam to fuse together and crystallize the three very thin layers. This cycle is repeated a plurality of times to make a homogenous crystalline optical recording medium of PtMnSb having a film thickness of 20 to 100 nm. Further, the energy of the Ar ion is effectively delivered directly to atoms or atom groups in the very thin film layers to promote the fusion and crystallization, thus contributing to local suppression of an elevation of temperature. Thus a good crystalline optical recording medium can be formed without causing thermal damage of the plastic substrate as of polycarbonate.

Although optical recording medium of PtMnSb was made with three targets, Ar ion beam and a rotating pallet carrying substrates in Embodiment 2 described above, various changes or modifications are allowed. In other words, the numbers of the targets may correspond to the number of components to be included in the final composite material As components of the optical recording medium may be used suitable materials of which typical examples include Heusler alloy; garnets of Bi- or Ga-substituted YIG and DyIG; uranium containing alloy, spinel ferrites represented by (Fe, M)$_3$O$_4$ where M is a member of the group consisting of Cr, Al, Mn, Li, Mg, Cu, Zn, Cd, Ti, V, Sn, Mo, Fe, Ni and Co; and hexagonal system crystal ferrites such as Ba ferrites. Other radiation beams (oxygen ion beam for optical recording medium of oxide) can be used. Other types of pallets carrying substrates such as a reciprocating pallet may be used.

What is claimed is:

1. A method of producing a protecting film for a magneto-optical recording medium, comprising the steps of:

disposing at least one sputtering target of ZnSe, at least one sputtering target of SiO$_2$, and a substrate in a vacuum chamber; and subjecting the substrate to sputtering from the sputtering targets sequentially while moving the substrate at an adequately high speed relative to a deposition rate from each sputtering target so that thin layers of the materials from the respective sputtering targets each having a thickness in the order of an inter-atom distance are sequentially stacked repeatedly a plurality of times to obtain a protective film of a composite material in which the ZnSe and the SiO$_2$ are uniformly distributed.

* * * * *